(12) United States Patent
Dilabio et al.

(10) Patent No.: US 9,065,059 B2
(45) Date of Patent: Jun. 23, 2015

(54) ASPHALTENE COMPONENTS AS ORGANIC ELECTRONIC MATERIALS

(75) Inventors: Gino A. Dilabio, Edmonton (CA); Iain Mackie, Edmonton (CA); Heather Diane Dettman, Edmonton (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 13/579,968

(22) PCT Filed: May 3, 2011

(86) PCT No.: PCT/CA2011/000490
§ 371 (c)(1),
(2), (4) Date: Aug. 20, 2012

(87) PCT Pub. No.: WO2011/137508
PCT Pub. Date: Nov. 10, 2011

(65) Prior Publication Data
US 2013/0043462 A1    Feb. 21, 2013

Related U.S. Application Data

(60) Provisional application No. 61/282,996, filed on May 5, 2010.

(51) Int. Cl.
*H01L 51/46* (2006.01)
*H01L 51/44* (2006.01)
*H01L 51/00* (2006.01)
*B82Y 10/00* (2011.01)
*C08L 95/00* (2006.01)

(52) U.S. Cl.
CPC ............ *H01L 51/0056* (2013.01); *B82Y 10/00* (2013.01); *C08L 95/00* (2013.01); *H01L 51/0045* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 4,440,669 | A | 4/1984 | Ivory et al. |
| 4,587,189 | A | 5/1986 | Hor et al. |
| 4,883,561 | A | 11/1989 | Gmitter et al. |
| 5,965,241 | A | 10/1999 | Mehta et al. |
| 6,322,941 | B1 | 11/2001 | Hsiao et al. |

(Continued)

FOREIGN PATENT DOCUMENTS

| | | |
|---|---|---|
| CA | 2 447 758 | 7/2004 |
| EP | 2128916 | 12/2009 |
| WO | 2008038047 | 4/2008 |

OTHER PUBLICATIONS

Castellanor, O. et al. "DFT Study of the alpha-pi and pi-pi internations between heteroaromatic polycyclic molecules: Implications of Asphaltene stability," International Society for Theoretical Chemical Physics (ISTCP VI), Abstracts (2008).*

(Continued)

*Primary Examiner* — Ling Choi
*Assistant Examiner* — Catherine S Branch
(74) *Attorney, Agent, or Firm* — Malcolm K. McGowan; Cermak Nakajima & McGowan LLP

(57) ABSTRACT

Asphaltene components are useful as organic electronic materials, especially in the form of thin films, in organic electronic devices, such as optoelectronic devices, for example, photodiodes (e.g., photovoltaic cells), phototransistors, photomultipliers, integrated optical circuits, photoresistors, and the like.

13 Claims, 5 Drawing Sheets

(56) References Cited

U.S. PATENT DOCUMENTS

| | | | |
|---|---|---|---|
| 6,413,655 | B2 | 7/2002 | Otani et al. |
| 6,531,234 | B1 | 3/2003 | Higashi et al. |
| 8,389,853 | B2 * | 3/2013 | Chianelli et al. ............... 136/263 |
| 2006/0180199 | A1 | 8/2006 | Lenhard et al. |
| 2007/0259475 | A1 | 11/2007 | Konemann et al. |
| 2007/0278459 | A1 | 12/2007 | Lenhard et al. |
| 2008/0084259 | A1 | 4/2008 | Yoshida et al. |
| 2008/0249309 | A1 | 10/2008 | Facchetti et al. |
| 2008/0277652 | A1 | 11/2008 | Mochizuki et al. |
| 2010/0038599 | A1 | 2/2010 | Holliday et al. |
| 2011/0005589 | A1 | 1/2011 | Chianelli et al. |

OTHER PUBLICATIONS

International Search Report dated Aug. 8, 2011 for PCT/CA2011/000490.
Written Opinion dated Aug. 8, 2011 for PCT/CA2011/000490.
Anariba, F, et al., Mono- and Multilayer Formation by Diazonium Reduction on Carbon Surfaces Monitored with Atomic Force Microscopy "Scratching", Anal. Chem. 2003, 75, 3837-3844.
Bredas, J-L, et al., Charge-Transfer and Energy-Transfer Processes in ŏ-Conjugated Oligomers and Polymers: A Molecular Picture, Chem. Rev. 2004, 104, 4971-5003.
Castellanor, O, et al., DFT Study of the σ-π and π-π Interactions Between Heteroaromatic Polycyclic Molecules: Implications on Asphaltene Stability, International Society for Theoretical Chemical Physics (ISTCP VI): Abstracts, (2008).
Chen, Z., et al., Self-assembled pi-stacks of functional dyes in solution: structural and thermodynamic features, Chem Soc Rev. Feb. 2009;38(2):564-84.
Chianelli, R., Asphaltenes too Valuable to Burn—New Hybrid Materials, University of Texas at El Paso Seminars Fall 2009.
Dettman, H., et al., Chemical Characterization of GPC Fractions of Athabasca Bitumen Asphaltenes Isolated before and after Thermal Treatment, Energy & Fuels 2005, 19, 1399-1404.
Dilabio, G, Accurate treatment of van der Waals interactions using standard density functional theory methods with effective core-type potentials: Application to carbon-containing dimers, Chemical Physics Letters 455 (2008) 348-353.
Evdokimov, I., et al., Electrical Conductivity and Dielectric Properties of Solid Asphaltenes, Energy Fuels 2010.
Forrest, S., The path to ubiquitous and low-cost organic electronic appliances on plastic, Nature vol. 428 Apr. 29, 2004.
Groenzin, H., et al., Molecular Size and Structure of Asphaltenes from Various Sources, Energy & Fuels 2000, 14, 677-684.
Johnson, E., et al., Dispersion interactions in density-functional theory, J. Phys. Org. Chem. 2009a, 22 1127-1135.
Johnson, E., et al., Theoretical Study of Dispersion Binding of Hydrocarbon Molecules to Hydrogen-Terminated Silicon(100)-2×1, J. Phys. Chem. C 2009b, 113, 5681-5689.
Mackie, I. et al., Interactions in Large, Polyaromatic Hydrocarbon Dimers: Application of Density Functional Theory with Dispersion Corrections, J. Phys. Chem. A 2008, 112, 10968-10976.
Murgich, J., et al., Molecular Recognition in Aggregates Formed by Asphaltene and Resin Molecules from the Athabasca Oil Sand, Energy & Fuels 1999, 13, 278-286.
Neuteboom, E., Photoinduced processes of functionalized perylene bisimides, Eindhoven : Technische Universiteit Eindhoven, 2004.
Newman, C., et al., Introduction to Organic Thin Film Transistors and Design of n-Channel Organic Semiconductors, Chem. Mater. 2004, 16, 4436-4451.
Nordgard El, et al., Langmuir films of asphaltene model compounds and their fluorescent properties, Aug. 19, 2008;24(16):8742-51.
Peramanu, S., et al., Molecular Weight and Specific Gravity Distributions for Athabasca and Cold Lake Bitumens and Their Saturate, Aromatic, Resin, and Asphaltene Fractions, Ind. Eng. Chem. Res. 1999, 38, 3121-3130.
Sill GA, et al., Semiconduction of Iodine Complexes of Asphaltenes 1969 Fuel 48, 61-74.
Sill GA, et al., Electrical Properties of Iodine Coxplexes of Asphaltenes, pp. 487-512, Mellon Institute 2006.
Stoyanov S., et al., Multiscale modelling of asphaltene disaggregationvol. 34, Nos. 10-15, Sep.-Dec. 2008, 953-960.
Takanohashi, T., et al., Structural Relaxation Behaviors of Three Different Asphaltenes Using MD Calculations, Petroleum Science and Technology vol. 22, Nos. 7 & 8, pp. 901-914, 2004.
Tan, X., et al., Pyrene Derivatives of 2,2'-Bipyridine as Models for Asphaltenes:Synthesis, Characterization, and Supramolecular Organization, Energy & Fuels 2008, 22, 715-720.
Vura-Weis, J., et al., Geometry and Electronic Coupling in Perylenediimide Stacks: Mapping Structure-Charge Transport Relationships, J. Am. Chem. Soc. 2010, 132, 1738-1739.

* cited by examiner

ASPHALTENE COMPONENTS AS ORGANIC ELECTRONIC MATERIALS

CROSS-REFERENCE TO RELATED APPLICATIONS

This application is a national entry of International Patent Application PCT/CA2011/000490 filed May 3, 2011 and claims the benefit of U.S. Provisional Patent Application U.S. Ser. No. 61/282,996 filed May 5, 2010, the entire contents of both of which are herein incorporated by reference.

FIELD OF THE INVENTION

This invention relates to organic electronic materials and devices comprising such materials. In particular, this invention relates to the use of asphaltene components as organic electronic materials.

BACKGROUND OF THE INVENTION

Much of the world's petroleum resources are in the form of bitumen (heavy and light oil fractions) mixed with sands and clays. These deposits are generally referred to as oil sands. Extraction of the bitumen from this source requires a larger input of energy relative to that required for conventional crude oil. Perhaps more significantly, the process also requires the use of fresh water and leaves behind large, but temporary, tailings ponds. The environmental impact of mining operations in, for example, the Canadian oil sands, has been the subject of much media discussion, in particular during the 2009 Copenhagen Summit.

Oil sand bitumen contains significant quantities of asphaltenes, which can form deposits in wells and pipelines, as well as insoluble nanosized aggregates under certain conditions (Murgich J, Abanero J A, Strausz O P. (1999) *Energy Fuels.* 13, 278-286). Asphaltenes are typically defined operationally as the fraction of oil that is pentane-insoluble and benzene-soluble. In some definitions, asphaltenes are defined operationally as the fraction of oil that is n-heptane insoluble and toluene-soluble. In both cases, asphaltenes are soluble in an aromatic solvent but insoluble in a low molecular weight saturated aliphatic solvent. Upgrading this bitumen requires the treatment/removal of asphaltenes, which seriously reduces the cost-effectiveness associated with the process. This is complicated by the fact that asphaltene structure and composition differ depending upon their source (Mansoori G A. (1988) *OPEC Review.* 12, 103-113). However, they are thought to be composed of central structures of extended aromatic systems with alkyl or alkylthiol substituents and/or bridges (Groenzin H, Mullins O C. (2000) *Energy Fuels.* 14, 677-684 and Tan X, Fenniri H, Gray M R. (2008) *Energy Fuels.* 22, 715-720.).

There remains a need in the art for new uses of asphaltenes. New uses for asphaltenes help reduce the environmental burden of bitumen extraction in which asphaltenes are often considered a waste product.

SUMMARY OF THE INVENTION

There is provided a use of an asphaltene component as an organic electronic material.

Asphaltene components useful in the present invention preferably consist essentially of a component of native asphaltene. The asphaltene itself is preferably isolated from crude oil by precipitation with a C5 or higher alkane, preferably a C5-C8 alkane, for example pentanes, hexanes, heptanes, octanes or mixtures thereof. The asphaltene component preferably consists essentially of an aggregate of aryl components linked by alkyl chains. Monomers in the asphaltene component preferably have an average molecular weight of about 4000 g/mol or less. Within the asphaltene component, such asphaltene component monomers may dimerize or oligomerize through physical processes. Preferably, the asphaltene component consists essentially of an elastic textured component of asphaltene isolated from the asphaltene by gel permeation chromatography. In particular, asphaltene component monomers isolated by gel permeation chromatography are not contained within void volume chloroform from two 4-foot columns packed with nonpolar, polystyrene adsorbants (Bio-Beads™ SX1) and a total volume of about 2×580 ml. The asphaltene component preferably comprises less than about 8% sulfur by weight based on total weight of the asphaltene component from Athabasca sources. However, it is recognized that asphaltenes originating from other regions may have a lower sulfur content.

Organic electronic materials comprising asphaltenes in accordance with the present invention are useful in the fabrication of electronic devices, for example photovoltaic cells, memory devices, computing devices and other electronic devices. Such organic electronic materials are especially useful in optoelectronic devices, for example, photodiodes (e.g., photovoltaic cells), phototransistors, photomultipliers, integrated optical circuits, photoresistors, and the like.

Thus, there is further provided an organic electronic device comprising a layer of electron-donating material in contact with a layer of electron-accepting material, one or both of the layers comprising a film of an asphaltene component.

In an organic electronic device, a junction is formed between the layers of electron-donating and electron-accepting materials, which permits the movement of electrons or holes upon exposure to electromagnetic radiation. This forms the basis on which the electronic device operates. The electron-donating and/or electron-accepting materials may comprise one or more other conductive organic materials. Such other conductive organic materials include, for example, pentacenes, poly(acetylene)s, poly(pyrrole)s, poly(thiophene)s (e.g., poly(3-alkylthiophenes)), polyanilines, polythiophenes, poly(p-phenylene sulfide), poly(p-phenylene vinylene)s, polyindole, polypyrene, polycarbazole, polyazulene, polyazepine, poly(fluorene)s and polynaphthalene.

In one illustrative embodiment of an organic electronic device, there is provided a photovoltaic cell comprising a first electrically conductive layer, a second electrically conductive layer, a layer of electron-donating material and a layer of electron-accepting material, the layers of electron-donating and electron-accepting materials forming a junction, and one or both of the electron-donating and electron-accepting layers comprising a film of an asphaltene component.

In the photovoltaic cell, the electrically conductive layers may comprise, for example, metallic material, transparent conductive materials, or combinations thereof. Transparent conductive materials are preferably transparent conductive oxides (TCO), for example indium-tin oxide (ITO), ZnO, ZnO:Al, $SnO_2$ and $SnO_2$:F. Metallic materials include, for example, gold, aluminum, silver, molybdenum, etc. The photovoltaic cell may further comprise one or more transparent substrates to provide protection for the layers and to permit easier handling of the cell. A transparent substrate may comprise, for example, glass, plastic, etc. Preferably, the photovoltaic cell is constructed with two transparent substrates, other layers being disposed between the two substrates. One or more current collector layers, for example metal strips and/or grids, may be included to act as current collectors.

Current collector layers are preferably formed on the transparent substrates between the substrates and other layers of the photovoltaic cell. Current collector layers preferably comprise a high conductivity metal, for example silver, aluminum, nickel, or a mixture thereof. One or more barrier layers may also be included to separate a substrate or substrates from the other layers of the photovoltaic cell. A barrier layer preferably comprises silicon dioxide or poly(3,4-ethylenedioxythiophene)poly(styrenesulfonate) (PEDOT:PSS). In the photovoltaic cell, one of the conductive layers acts as one electrode and the other conductive layer acts as the other electrode. Conductive elements, for example wires, are attached to each electrode and to a load to complete a circuit. Conductive elements may be attached to the conductive layers directly, or preferably conductive elements are attached to the current collector layers when they are present in cell.

Fabricating an organic electronic device involves forming layers of the various components from thin films. Thin films may be formed using any suitable technique, for example, screen printing from a paste, evaporation, sputtering, spray deposition, pyrolysis deposition, vacuum deposition or coating from a sol-gel solution by using spin-coating, ink-jet printing or dip-coating. Films may be further processed, for example, by imprinting and/or sintering to impart further desired characteristics. The particular technique is dependent on the type of material involved.

Thus, there is further provided a film comprising an organic electronic material comprising an asphaltene component.

In general, methods for the design and fabrication of electronic devices, including photovoltaic devices are known in the art (Newman C R, Frisbie C D, da Silva Filho D A, Brédas J-L, Ewbank P C, Mann K R. (2004) *Chem. Mater.* 16, 4436-4451.). Devices have been constructed using organic electronic materials (e.g., organic light emitting diodes or organic field effect transistors). For example, in order for an organic semiconductor to function as a good thin film transistor, several desirable properties are necessary: (a) Conjugated π-electron system with high electron affinity; and (b) Good intermolecular electronic overlap; and (c) Good film-forming properties; and (d) Chemical purity. Further properties can also be considered desirable: (e) Solution processability; and (f) Low carrier trap density; and (g) Ohmic contacts.

Within this invention it is demonstrated that asphaltene components possess many of these said properties.

Electronic properties of thin films and organic electronic devices comprising organic electronic material comprising asphaltene components may be fine tuned or enhanced with the use of one or more dopants in the organic electronic material. The one or more dopants may be n-type or p-type dopants or a mixture thereof. Doping is preferably achieved by addition of an acid or an acid salt, for example a mineral acid, an organic acid (e.g. sulfonic acids, phosphonic acids, phenols, carboxylic acids), a salt thereof or a mixture thereof. Some examples of suitable dopants include $H_2SO_4$, HCl, $LiClO_4$, LiCl, $NaClO_4$, NaCl, NaBr, $Na_2SO_4$, $Et_4NCl$, $Bu_4NPF_6$, sodium p-toluenesulfonate, sodium poly(styrenesulfonate) (sodium PSS), camphor-10-sulfonic acid (CSA), dinonylnaphthalenesulfonic acid (DNSA), dinonylnaphthalenedisulfonic acid (DNDSA), dodecylbenzenesulfonic acid (DBSA), cardanol azosulfonic acids, polyvinylphosphonic acid (PVPA), poly(alkylene phosphates), heptadecafluorooctanesulfonic acid, perfluorodecanoic acid, perfluorooctanoic acid and nonafluorobutane-1-sulfonic acid. Doping arising from oxygen and/or water incorporation from exposure of the organic material to the open atmosphere is also possible (vide infra). Doping levels that range between 0-900% (mol/mol) may be employed, however a doping level of 0.01-35% (mol/ mol) is preferred. Suitable dopants are generally known in the art (Stephen R. Forest, Nature (2004) 428, 911-918).

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIG. 4 depicts I-V curves for.

DESCRIPTION OF PREFERRED EMBODIMENTS

Figure 1:
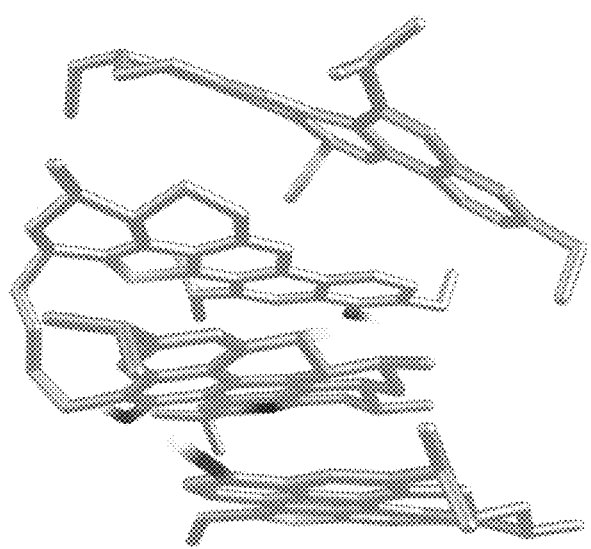
FIG. 1 depicts the calculated structure of the asphaltene aggregate model ABC obtained with PBE-DCP/6-31+G(d,p) with H atoms omitted for clarity.

Strong interactions between side chains and π-faces of asphaltenic systems explain the tendency for strong self-association and the difficulties in their characterization. While such non-covalent interactions are detrimental for bitumen processing, they are at the same time responsible for favorable interactions in substances used for organic electronic devices. Strong π-stacking interactions between polyaromatic systems is a highly desirable property of organic electronic systems because such overlap allows for facile transport of electrons or holes (Newman 2004).

Native asphaltenes are not good conductors (Sill G A, Yen T F. (1969) *Fuel* 48, 61-74.), and are therefore not suitable as organic electronic materials. The inventors have verified this by using an interdigitated electrode (IDE) device. However, components of asphaltenes, for example as disclosed vide infra, should display physical and electronic characteristics, viz., strong, non-covalent π-stacking and large orbital splittings; indicative of excellent organic electronic materials. Such components can be separated by the methodology described vide infra. Using dispersion-corrected density-functional theory to calculate the structures for strongly interacting asphaltene components, it has now been shown in the present invention that these asphaltene models (Scheme 1) exhibit large orbital splittings which are comparable to known electronic materials such as polythiophene and pentacene.

The following examples show experimentally that isolated asphaltene components do indeed act as organic electronic materials, contrary to previous art.

Scheme 1 - Model asphaltene components A, B and C form an interacting aggregate

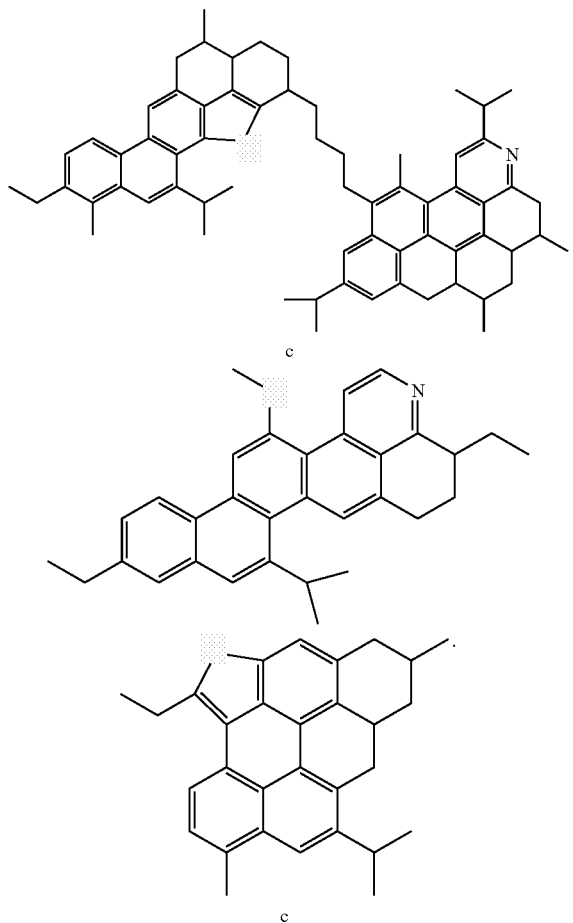

Calculation Methodology:

The inclusion of long-range dispersion in density-functional theory DFT (Johnson E R, Mackie I D, DiLabio G A. (2009a) *J. Phys. Org. Chem.* 22, 1127-1135) now allows for the modeling of very large systems, such as asphaltenes. Recently it has been shown that dispersion-correcting potentials (DCPs) (DiLabio G A. (2008) *Chem. Phys. Lett.* 455, 348-353; Johnson E R, DiLabio G A. (2009b) *J. Phys. Chem. C.* 113, 5681-5689) can be used to correct the long-range behavior of many DFTs, including the B971 and PBE functionals. These methods are used to calculate the non-covalent interactions between asphaltene monomers and/or fragments. In this method, DCPs (simple, atom-centered potentials that can be included as input to many programs) correct the long-range behavior in weakly bonded systems (Mackie I D, DiLabio G A. (2008) *J. Phys. Chem. A.* 112, 10968-10976). Carbon DCPs were used with the Gaussian program (Frisch M J, et al. (2004) *Gaussian* 03, *Revision D*.01. (Gaussian Inc., Pittsburgh Pa.).) in the present work to correct the long-range behavior.

The splitting-in-dimer approach (Brédas J-L, Beljonne D, Coropceanu V, Cornil J. (2004) *Chem. Rev.* 104, 4971-5003) is also used to show that well π-stacked asphaltenic models have orbital band widths which may reflect very large charge mobilities. This approach can be described as follows: The orbital splitting, $S_{HOMO}$, defined as the energy separation between the highest occupied molecular orbital (HOMO) and the HOMO−1, reflect the Marcus-theory transfer integral associated with hole transport. $S_{LUMO}$, the energy separation between the lowest unoccupied molecular orbital (LUMO) and the LUMO+1, likewise reflects the transfer integral associated with electron transport. Using this simple technique in combination with structures obtained using DFT-DCP approaches allows assessment of the electronic properties of asphaltene-type materials. Vura-Weis et al. have very recently applied a similar combination of approaches to study stacked perylenebisimides (Vura-Weis J, Ratner M A, Wasielewski M R. (2010) *J. Am. Chem. Soc.* 132, 1738-1739).

EXAMPLE 1

Example Model of Asphaltene Components

Calculations were performed on an asphaltene model shown in Scheme 1 (ABC, $C_{125}H_{132}N_2O_3S_3$). This molecular formula is derived from experimental $^1H$ and $^{13}C$ NMR, and from mass spectroscopy measurements (Takonahashi T, Sato S, Tanaka R. (2004) *Petr. Sci. Tech.* 22, 901-914). Previous modeling work has been done under the assumption that the components aggregate around an open, central structure of A (Stoyanov S R, Gusarov S, Kovalenko A. (2008) *Mol. Sim.* 34, 953-960). This central structure should have a folded form in which the two heterocyclic polyaromatic moieties of A can maximize their stability by π-stacking. Optimization calculations using PBE/6-31+G(d,p) with DCPs on an open and folded form confirmed this, predicting that the folded form of the aggregate (see FIG. 1) is more stable than the open form by about 9 kcal/mol. NMR work lends support for a closed form for asphaltenes similar to that in FIG. 1.

It is not straightforward to apply the splitting-in-dimer approach to an aggregate of molecules. Nevertheless, some insight into the potential for charge transport may be gained by applying this approach to ABC. The orbital splitting was calculated for the structure of A optimized within the aggregate structure shown in FIG. 2. This gives $S_{HOMO}$ and $S_{LUMO}$ values of 140 and 244 meV, respectively, and indicates that this moiety may have substantial ambipolar transport characteristics. Assessing orbital splittings between components of the full aggregate (ABC) gives large occupied orbital splittings between asphaltene components, viz., S(AB)=121 and S(AC)=536 meV, the latter value pointing to the possibility for significantly large hole transport.

Therefore, the theoretical results support the contention that a component of asphaltenes has electronic structure properties desirable in organic electronic materials.

EXAMPLE 2

Experimental Asphaltene Isolation Procedure
(Dettman H D, Inman A, Salmon S, Scott K., Fuhr, B. (2005) *Energy Fuels* 19, 1399-1404.)

Asphaltenes were precipitated from the D1160 vacuum residues [boiling point (bp)+524° C.] of global crude oils with pentane, using a single treatment of the procedure outlined in Peramanu et. al (Peramanu S, Pruden B P, Rahimi P. (1999) *Ind. Eng. Chem. Res.* 38, 3121-3130.). This method includes adding 40-volumes of pentane, sonicating in a bath sonicator for 45 min, leaving the mixture to rest overnight at room temperature, then sonicating for an additional 30 min before filtering, and washing with pentane until the eluent is colorless. Trace pentane was removed from the asphaltenes precipitate by heating the asphaltenes to 45° C. in a vacuum oven overnight.

Figure 2:
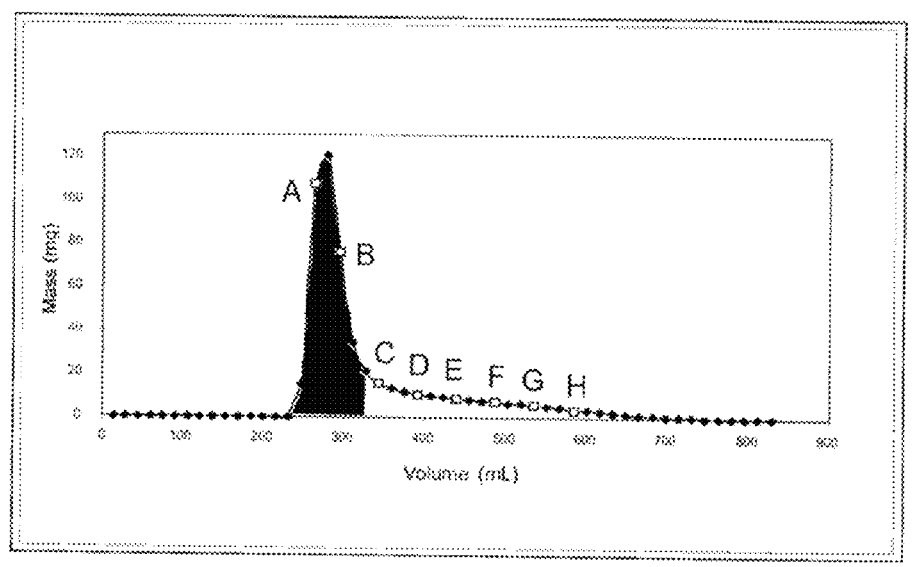
FIG. 2 depicts the gel permeation chromatography elution profile of pentane asphaltenes, run using nonpolar, polystyrene adsorbants (SX-1 Biobeads™) in chloroform.

Gel permeation chromatography was run on the asphaltenes using nonpolar, polystyrene adsorbants (Bio-Beads™ S-X1 purchased from Bio-Rad). These beads are reported to have a molecular weight separation range from 600 to 14,000 g/mol and comprise styrene divinylbenzene beads with 1% crosslinkage and a 40-80 pm bead size. Two 4-ft columns (volume of approximately 580 ml. each) were prepared using beads suspended in tetrahydrofuran. The columns were connected in series and were washed with three bed volumes of chloroform (void volume was approximately 190 mL). The pump flow rate was set to 0.7 mL/min for all runs with a pressure of 3 psi measured. (SX-1 beads can withstand pressures up to 100 psi). It was found that the elution rate was not constant for all samples and so fraction volumes were measured at regular intervals to be able to standardize elution profiles by volume rather than by time. For each run, approximately 2 g of asphaltene sample was dissolved in 5 mL of chloroform and was sonicated in a bath sonicator for at least 1 h to homogenize. Fractions were collected in 20-mL test tubes using an LKB fraction collector, taking 30 h to complete. A typical elution profile for Athabasca bitumen asphaltenes is shown in FIG. 2. Fractions were dried under nitrogen in a TurboVap™ evaporator with water bath temperature at 45° C. Fractions were then put in a vacuum oven at 45° C. overnight before final weights were measured.

Asphaltene Characterization:

FIG. 2 indicates that two physically different types of samples were isolated. That which is eluted in the first few fractions (i.e. within the void volume of the column) possesses a graphitic texture (including the fractions labeled A & B). By fraction C the samples possess an elastic texture. The ratio of the latter (elastic textured components) to the former (graphitic textured components) was in the range of 40:60 wt %. Similar ratios were obtained for pentane asphaltenes isolated from heavy crude oils originating from both South America and the Middle East. The retention of the asphaltene components, viz., fraction C and longer, are characteristic of those components with the desired conductive properties. Note, however, that retention is dependent on the type of column employed, how it is packed and with what material it is packed.

EXAMPLE 3

Asphaltene Experimental Conductance Measurements

Three samples of C5 native asphaltene were studied for their electrical conductive properties—Sample 1 consisted of native asphaltene, without component separation; Sample 2 consisted of the early asphaltene fraction (A & B), as acquired from the procedure outlined above; and Sample 3 consisted of the later eluent asphaltenes. The procedure of measuring conductance can be described as thus:

Asphaltene was dissolved in 2 mL of toluene; the sample spin-coated (1000 rpm for 65 seconds) on a lithography-patterned inter-digitated electrode (IDE, 10 µm separation and 600 digits) on p-Si substrate with 300 nm thermal oxide as an insulating layer. The height of the IDE was 105 nm, constituted by 5 nm Cr (adhesion layer) and 100 nm Au. The sample was dried under vacuum ($2 \times 10^{-6}$ torr) for 24 hours, with all experimental data collected under vacuum, and in darkness.

In order that the resistivity of the sample can be determined, the thickness of the sample must be measured. Sample thickness was measured by an atomic force microscopy (AFM) scratching technique (Anariba F, DuVall S H, McCreery R L. (2003) *Anal. Chem.* 75, 3837-3844.), whereby an AFM cantilever is used in contact mode with a force high enough to scratch away the spin coated layer but not scratch into the $SiO_2$ layer. After scratching, the same AFM cantilever is used to image the scratched region in tapping mode. The depth of the layer is determined by the height difference between the unscratched and scratched regions.

Figure 3:
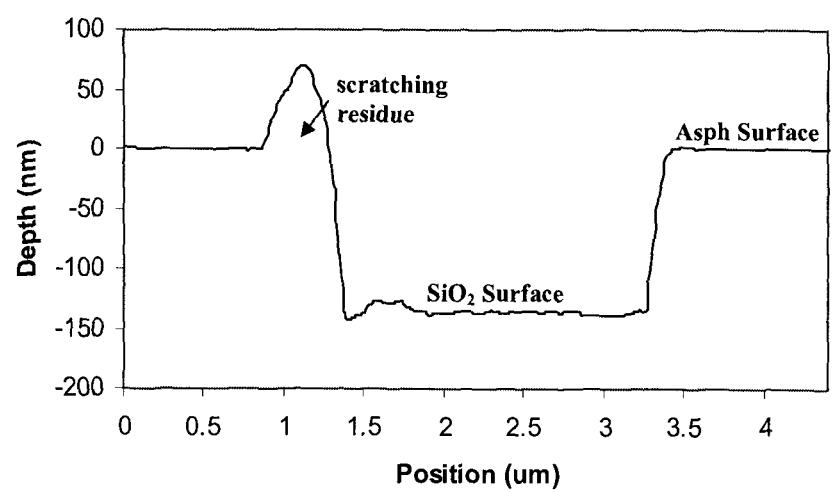
FIG. 3 depicts the measurement of the thickness of Sample 3.

For the IDE device spin-coated with Sample 3, contact mode was used to scratch a trench 4 µm×4 µm between two digits (10 µm separation). In tapping mode, an 8 µm×8 µm area, including the scratched region, was imaged. The measured thickness was 135.6±3.2 nm, see FIG. 3. The conductance was determined by measuring current as a function of applied voltage by making contact to each "macro" terminal of the IDE device.

Asphaltene Experimental Conductance Data:

The measured experimental data can be summarized as follows:

1. Native asphaltene shows no conductive properties, confirming the conclusions of Sill, who showed that doping by iodine was necessary in order to make asphaltene conductive (Sill 1969).

2. Sample 2 was measured as non-conductive. This suggests the need for further processing and/or different deposition techniques to make the early separated asphaltene fraction operative as an organic electronic material.

Figure 4A:
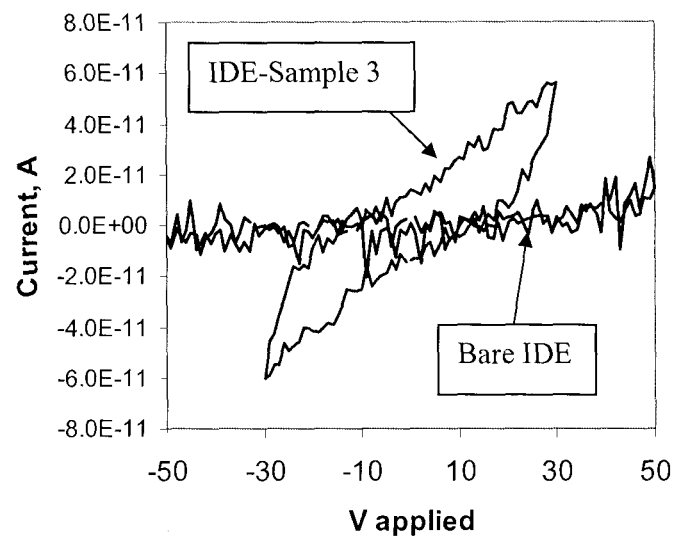
FIG. 4A: bare inter-digitated electrode (Bare IDE) and Sample 3 spin-coated on IDE (IDE-Sample 3)
Figure 4B:
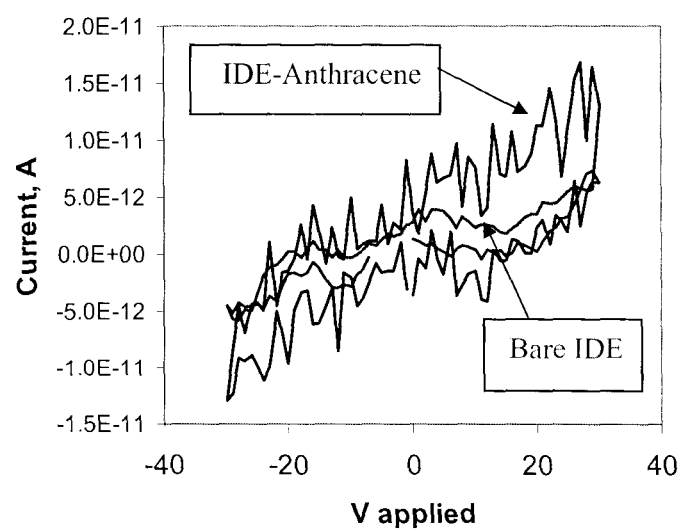
FIG. 4B: inter-digitated electrode (Bare IDE) and anthracene (IDE-anthracene) spin-coated on IDE.

3. At ambient temperature, Sample 3 shows improved conductance over anthracene, measured using the same procedure, see FIG. 4. Resistivity measurements of ca. $4.9 \times 10^{12}$ Ω·cm (asphaltene) and ca. $4.56 \times 10^{13}$ Ω·cm (anthracene) were obtained. Such data are sensitive to noise conditions, but the asphaltene data is based upon an average of 9 different measurements on the same sample. Furthermore, statistical analysis using the paired t student (2-tails) test indicates significant difference between bare IDE and IDE-Sample 3, with 95% confidence.

Figure 5:
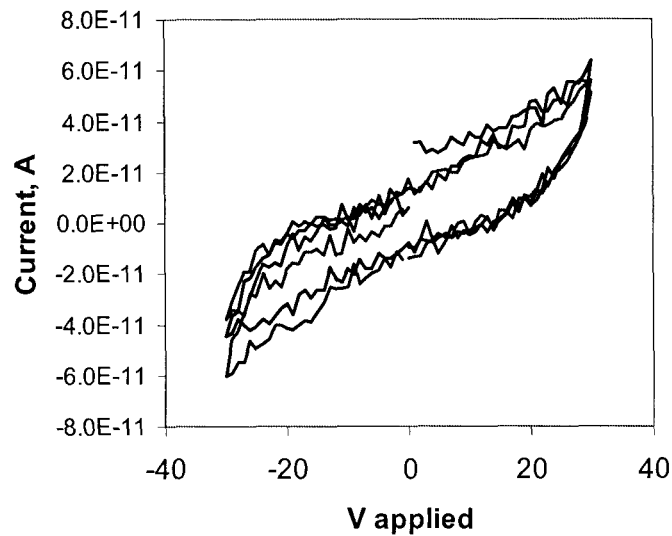
FIG. 5 depicts I-V curves for three separate measurements on Sample 3, indicating reproducibility.

4. FIG. 5 shows an overlay of 3 different measurements, indicating that the electrical behavior of Sample 3 is reproducible.

Figure 6:
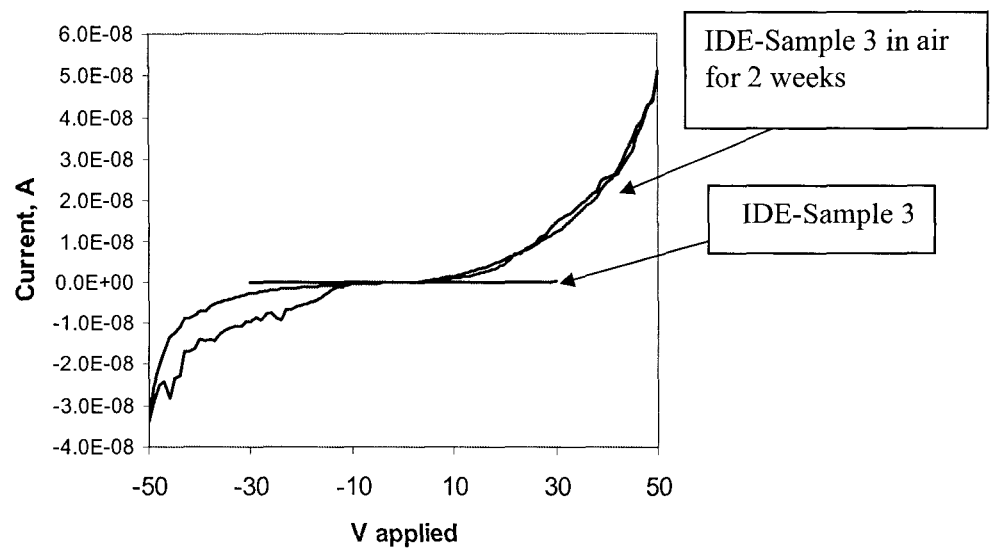
FIG. 6 depicts I-V curves for Sample 3 spin-coated on IDE as prepared, and after set in air for 2 weeks; and, FIG. 7 depicts I-V curves for Sample 3 spin-coated on IDE as prepared and after heating in vacuum to 375 K.

5. Setting the same Sample 3 as used for (3) in ambient atmosphere for 2 weeks resulted in increased conductance (by ca. 3 orders of magnitude). Such a response is common to many known organic electronic materials, possibly as a result of water or oxygen impurities, or from the effects of UV radiation. However, FIG. 6 suggests that the structure of the asphaltene component can support charge, and therefore that the sample can be gated.

Figure 7:
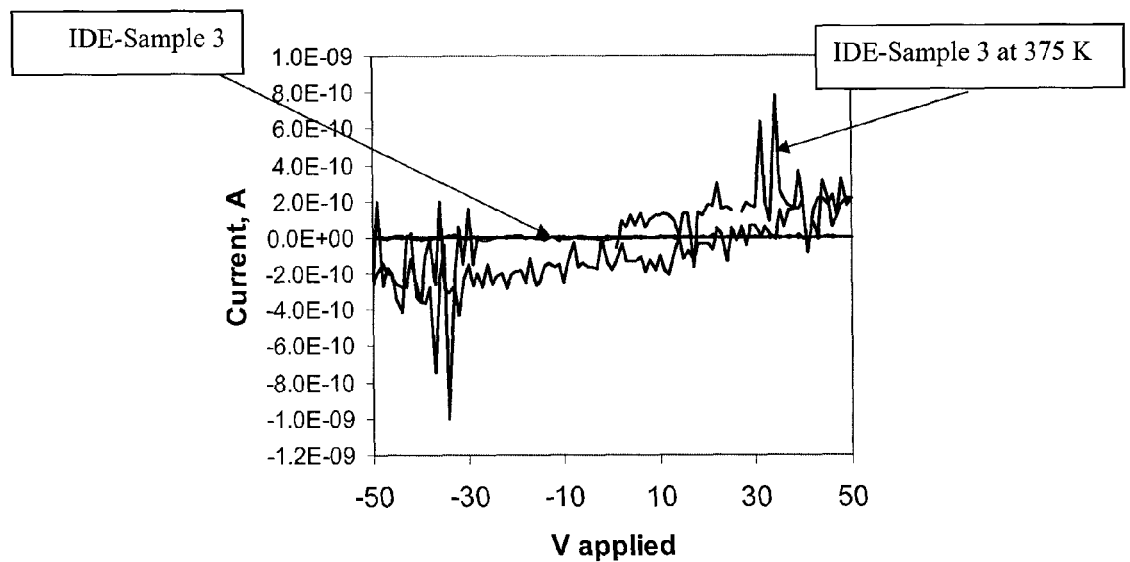

6. Qualitatively similar results as for (5) were obtained upon heating Sample 3 to 375 K; the current increased by about one order of magnitude, as shown in FIG. 7. This temperature effect is reversible upon sample cooling, suggesting that an activated conductivity phenomenon is in effect. Furthermore, this indicates that the sample shows semiconductor behavior rather than metallic.

The present invention includes asphaltene components having the desired properties to make excellent organic electronic devices. Advantages over known molecules in the art (e.g., rubrene, pentacene, tetracene, and polythiophenes) include making use of an already synthesized chemical, with only simple separation required from what is an air stable species. Turning what was previously thought of as a waste product into a useful device can also be considered advantageous.

The entire contents of each of the references referred to herein are hereby incorporated by reference.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventors to be encompassed by the following claims.

The invention claimed is:

1. An organic electronic material comprising an asphaltene component, wherein the asphaltene component consists essentially of an aggregate of aryl components linked by alkyl chains and further, wherein the asphaltene component consists essentially of an elastic component of asphaltene isolated from an asphaltene by gel permeation chromatography.

2. The organic electronic material of claim 1, wherein the organic electronic material comprises a film of the asphaltene component.

3. The organic electronic material of claim 1, wherein the organic electronic material is used in an organic electronic device.

4. The organic electronic material of claim 3, wherein the organic electronic device comprises a layer of electron-donating material in contact with a layer of electron-accepting material, one or both of the layers comprising a film of the asphaltene component.

5. The organic electronic material of claim 3, wherein the device is an optoelectronic device.

6. The organic electronic material of claim 3, wherein the organic electronic device is a photovoltaic cell comprising a first electrically conductive layer, a second electrically conductive layer, a layer of electron-donating material and a layer of electron-accepting material, the layers of electron-donating and electron-accepting materials forming a junction, and one or both of the electron-donating and electron-accepting layers comprising a film of the asphaltene component.

7. The organic electronic material of claim 1, wherein the organic electronic material further comprises a dopant.

8. The organic electronic material of claim 1, wherein monomers in the asphaltene component have an average molecular weight of 4000 g/mol or less.

9. The organic electronic material of claim 1, wherein monomers in the asphaltene component are not contained within void volume chloroform from two 4-foot columns packed with nonpolar polystyrene adsorbants and a total volume of about 2×580 ml.

10. The organic electronic material of claim 1, wherein the asphaltene component is a component of an asphaltene isolated from crude oil by precipitation with pentane.

11. The organic electronic material of claim 1, wherein the asphaltene component comprises less than 8% sulfur by weight based on total weight of the asphaltene component.

12. A film comprising the organic electronic material as defined in claim 1.

13. An organic electronic device comprising a layer of electrondonating material in contact with a layer of electron-accepting material, one or both of the layers comprising the film as defined in claim 12.

* * * * *